United States Patent [19]

Lorenz et al.

[11] Patent Number: 5,687,184

[45] Date of Patent: Nov. 11, 1997

[54] METHOD AND CIRCUIT ARRANGEMENT FOR SPEECH SIGNAL TRANSMISSION

[75] Inventors: Dietmar Lorenz, Erlangen; Karl Hellwig, Nürnberg, both of Germany

[73] Assignee: U.S. Philips Corporation, New York, N.Y.

[21] Appl. No.: 323,205

[22] Filed: Oct. 14, 1994

[30] Foreign Application Priority Data

Oct. 16, 1993 [DE] Germany ............... 43 35 305.3

[51] Int. Cl.[6] .................... G06F 11/10; H03M 13/12
[52] U.S. Cl. .................. 371/43; 375/260; 375/346; 370/464; 395/2.09
[58] Field of Search .............. 371/31, 37.7, 37.8, 371/37.9, 41–45, 4, 5.1; 375/260–265, 341–346; 370/95.1–95.3; 395/2, 2.35–2.42

[56] References Cited

U.S. PATENT DOCUMENTS

| | | | |
|---|---|---|---|
| 5,245,428 | 9/1993 | De With et al. | 358/133 |
| 5,341,401 | 8/1994 | Farjh et al. | 375/94 |
| 5,430,743 | 7/1995 | Marturano et al. | 371/43 |
| 5,432,778 | 7/1995 | Minde et al. | 370/95.3 |
| 5,440,670 | 8/1995 | Frazier | 395/22 |

Primary Examiner—Reba I. Elmore
Assistant Examiner—Emmanuel L. Moise
Attorney, Agent, or Firm—Arthur G. Schaier

[57] ABSTRACT

When speech data are transmitted via radio in the European mobile radio telephone system according to the GSM standard, always 20 ms speech data are transmitted as source-coded code words between the mobile stations and the fixed stations. The fixed stations are again connected to a central station via a connection having a smaller bandwidth, in which central station the speech decoders are arranged. Since transmission errors which cannot be corrected by the channel decoder in prior-art system are masked in the channel decoder in the central station, only a very simple error masking option is provided. According to the invention, the channel decoder which is arranged in the mobile and fixed stations close to the receiver, more signals are derived which feature the reliability of the received data and, in dependence on these additional data, extensive different error masking measures are carried out on the received code words. This does not only take place in the mobile station, but also in the fixed station. This fixed station then applies only already modified error-free code words to the central station which need not be modified because of this, but in which only the available simple error masking possibilities are not utilized. This may considerably improve the speech quality in disturbed transmission, without intervening in the GSM standard especially during transmission between the base stations and the central station.

15 Claims, 5 Drawing Sheets

5,687,184

METHOD AND CIRCUIT ARRANGEMENT FOR SPEECH SIGNAL TRANSMISSION

BACKGROUND OF THE INVENTION

The invention relates to a system comprising a first station and at least a second station, for transmitting speech signals between the stations, in which each station comprises a transmitting section for converting the speech signals of a time slot of given length to a plurality of bit code word groups having different connotations and for converting the bits to channel bits of a channel code and for transmitting the channel bits as a bit block, and also comprises a receiver which includes a receiving section for receiving and demodulating transmitted bit blocks to produce channel bits and which receiver includes a channel decoder for producing code word groups which have different connotations from the channel bits on a channel output and for producing error detection signals on at least one error output, at least one station comprising an error masking circuit coupled to the channel output, which error masking circuit includes a memory for code word groups of a previous bit block to produce modified code word groups in response to error detection signals, and a speech decoder for producing speech signals from the modified code word groups, as well as a receiver for receiving bit blocks formed in this manner and a method of speech signal transmission.

Such a system in which the first station is a base station and the second stations are mobile stations, corresponds to the digital European mobile radio system according to the GSM full rate standard in Germany called the D1 network and D2 network and is discussed, for example, in the journal of "Frequenz" 42 (1988), Vol 2/3, pages 85 to 93. To transmit speech signals having sufficient quality as is the case, for example, with a logarithmic PCM coding with 8 bits per sample and 8 kHz sampling frequency, a 64 kbits/s bit rate is necessary which is available in the wire-bound telephone system. For the transmission in the digital radio telephone network, the effective bit rate for speech signals is restricted to a maximum of 13 kbits/s for reasons of frequency economy, so that for the transmission of speech signals of sufficient quality, source coding methods are to be used. For this purpose, the speech signal is processed in complex manner as is known, also from afore-mentioned article, to obtain a plurality of code words for each time section of 20 ms of the speech signal, which code words are transmitted as a coherent bit block. The code words of a bit block have different connotations and faults in these code words have different effects on speech signals to be transmitted and, furthermore, it is essential which bit position of a code word is faulty.

For this reason, the bits having the greatest effect on the speech signal to be transmitted and occurring in the code words are combined and provided with a test word to derive more easily a quality feature at the receiving end and recognize better whether the bit block is still so faulty after the channel decoding that an annoying noise is generated when speech data are transmitted. Additionally, these code word bits protected by the test word together with further bits which have less effect are subjected to a channel coding which makes a certain error correction possible. Bits on least significant bit positions of the code words, on which bit positions errors do not generate very annoying faults in the speech signal to be transmitted, but are important for a good speech quality, are finally not coded any further and transmitted uncoded. In the known mobile radio telephone system, error masking measures are taken for the received bit blocks or the code words derived therefrom only when an error has been detected via the test word, because only then is a considerable fault in the speech signal assumed. In the event of such a fault, the code words of the previous bit block are repeated. This does produce a certain corruption of the speech signal, which phenomenon, however, is subjectively less annoying than a speech signal formed from code words in which the most significant bit positions are faulty.

It has been established that the protection of the most significant bits of the code words by the test word is not always adequate, because especially in the case of more faults these most significant bits of the code words may be disturbed without an error being detected via the test word, as the errors caused by the faults cancel each other out. On the other hand, rather large faults on the further bit positions of the code words, which code words are protected less or not protected at all from errors and in which code words faults/errors cannot be detected from the receiving end, can still become apparent in rather strong annoying noises in the transmitted speech signal.

OBJECTS AND SUMMARY OF THE INVENTION

Therefore, it is an object of the invention to provide a system of the type defined in the opening paragraph, in which also rather small faults in the received bit block can be detected and various degrees of faults can be dealt with, so that only the least possible impact in the produced speech signal occurs.

According to the invention, this object is achieved in said system in that the channel decoder of at least several stations in the system is arranged for supplying on at least one error output error signals which indicate the extent of the fault in the received bit block and in that the error masking circuit is arranged to store in the memory only several of the code words of a previous bit block and, in dependence on error signals, to modify at least several of the code words of the received bit block in a different manner.

The invention is based on the recognition that with channel decoding considerably more messages about faults in the received bit block can be obtained than is possible with the known system with only the test word. Since, on the other hand, the code words of a bit block have different connotations and thus also have different effects on the speech signal to be produced, these different code words are also differently modified according to the invention in the case of different faults. This provides a considerable improvement of the quality of the transmitted speech signals in the case of faults in the received bit block.

In the radio telephone system defined above, in which in each station the transmitting section is arranged for producing a first, a second, a third and a fourth code word group from the speech signals of each time slot and which code word groups each contain several bits, for forming from the bits on predefined bit positions of all the code words together a test word of at least one bit and for transmitting this test word together with the channel bits of the bit block, it is purposeful according to an embodiment of the invention that the channel decoder is arranged for supplying on a first error output a test word error signal and, additionally, on a second error output an error value, and in that the error masking circuit includes a first threshold comparator for comparing the error value with several error thresholds, a fault indication circuit coupled at least to the first error output of the channel decoder for producing a fault indication signal on the first error output in dependence on at least the test word error signal, a classification circuit coupled to the first threshold comparator for producing one of a number of different error class signals in dependence on the exceeded error threshold and the fault indication signal, and includes a code word controller driven by the error class signals, to modify, in dependence on produced error class signals, at least several of the code word groups supplied by the channel decoder, more specifically, by substituting a code word group derived from the code words of the memory for several of the code word groups supplied by the channel decoder. The error thresholds make it possible to form a plurality of error classes in a simple manner and already with a very small number of error classes it is possible to modify the code word groups individually. Since several code word groups strongly affect the speech signal in the composite time slot, a modification of these code word groups is already advantageous in the case of low error rates. In the case of higher error rates also the other code word groups are obviously to be modified.

In the known radio telephone system error masking measures for the bit blocks transmitted from the fixed station are integrally carded out in the mobile station. Conversely, error masking measures to be carded out on the bit blocks transmitted by the mobile station are not carried out in the fixed station, but the fixed station carries out the channel decoding and transmits the received code words together with a signal indicating an error detected via the test word to a central station where the error masking measures are carded out and the speech signals are again produced and fed to the wire-bound telephone network. Error masking measures are specifically carried out because the error masking measures are considered to form a whole with the device for producing speech data from the received code words, and the connection between the fixed station and the central station has only a limited bandwidth. Due to this limited bandwidth it would be possible to transmit only few information signals about the reliability of the received bit blocks, which bit blocks can, in principle, be formed during the channel decoding, so that only simple error masking measures, that is to say, a repetition of the code words of the previous bit block, can be taken in the case of an error detected via the test word. On the other hand, the transmission format between the fixed station and the central station is fixed in that in addition to specific control information only the code words and a bit that indicates the detection of an error via the code word, are transmitted. To carry out even more extensive error masking measures, without modifying this transmission format, it is purposeful in a system according to the invention in which the first station is a fixed station and the second stations are mobile stations according to a further embodiment of the invention, that also in the fixed station the channel decoder is arranged for producing at least the error signals and the error masking circuit is provided for modifying the code words of the channel decoder in dependence on the error signals in the fixed station. Carrying out the error masking measures is thus completely separated from the reconstruction of the speech signals and, therefore, extensive error masking measures can be carried out because in the fixed station it is possible to exchange an almost random number of information signals between the channel decoder and an error masking arrangement. In that case always code words are produced which have already been processed in the error masking arrangement and the bit that is to indicate the detection of the error via the test word continues to have a signal value that corresponds to error-free test words. As a result, no modifications need be carried out in the central station, but this central station no longer carries out error masking measures, because it receives code words labelled as error-free. In this manner, carrying out extensive error masking measures according to the invention is compatible with the known radio telephone system.

The invention further relates to a receiver for such a system, for receiving bit blocks of which each bit block is formed by speech signals of a time slot of a given duration, in that the speech signals are convened to a plurality of code word groups consisting of bits and having different connotations and the bits of these code word groups are converted to channel bits of a channel code, which receiver comprises a receiving section for receiving and demodulating transmitted bit blocks to produce channel bits, a channel decoder for producing code words having different connotations from the channel bits on a channel output and for producing error indication signals on at least one error output of an error masking circuit coupled to the channel output, which error masking circuit includes a memory for code word groups of a previous bit block, to produce modified code word groups in dependence on error indication signals, and includes a speech decoder for producing speech signals from the modified code word groups. Such a receiver is characterized according to the invention in that the channel decoder is arranged for producing on at least one error output error signals which indicate the extent of the fault in the received bit block and in that the error masking circuit is arranged for storing in the memory only several of the code words of a previous bit block and, in dependence on the error signals, modifying at least several of the code words of the received bit block in a different manner.

In that case the possibility is used that from the channel decoder more accurate information about the extent of faults can be obtained, so that various measures for masking errors can be taken purpose-oriented. To modify the code word groups it is not necessary either, according to an aspect of the invention, to store all the code word groups of the previous bit block because in the case of specific errors or faults several bit blocks can also be replaced by fixed values which will be further explained in the embodiments.

In the radio telephone system defined in the opening paragraph, each receiver comprises the channel decoder for producing, on the channel output, a first, a second, a third and a fourth code word group and, on a first error output, a test word error signal from each bit block, the first code word group denoting filter coefficients, the second code word group denoting amplitude values, the third code word group denoting long-term coefficients and the fourth code word group denoting individual coded residual signals of the speech signal for the reconstruction of transmit speech signals, and the test word error signal being derived from a test word contained in the bit block. Especially for this case it is advantageous, according to an embodiment for the receiver according to the invention, that the channel decoder is arranged for additionally supplying an error value on a second error output, and in that the error masking circuit comprises a first threshold comparator for comparing the error value with several error thresholds, a fault indication circuit coupled at least to the first error output of the channel decoder and used for supplying a fault indication signal on the first error output in dependence on at least the test word error signal, a classification circuit coupled to the first threshold comparator, for producing an error class signal from a number of different error class signals in dependence on the exceeded error threshold and the fault indication signal, and comprises a code word controller driven by the error class signals, to modify, in dependence on applied error class signals, at least the first two code word groups produced by the channel decoder, specifically by replacing a code word group derived from the code words of the memory. The formation of error classes by the comparisons with various error thresholds makes it possible that the code word groups can easily be modified purpose-oriented.

Further embodiments of the receiver according to the invention are defined in further dependent claims.

The invention further relates to a method of transmitting speech signals between a first station and at least a second station in accordance with the method defined in the opening paragraph, in which the speech signals of a given time slot are converted to several multi-bit code words having different connotations, while the bits are recoded into channel bits of a channel code and are transmitted as a bit block, from which bit block the receiving end channel decoding derives the code words and a quality feature and predefined error masking measures for producing modified code words are triggered and transmit speech signals are formed from the modified code words at least when an error is discovered via the quality feature.

With this method well-tuned measures for error masking are applicable for different degrees of faults in the received bit block, so that only the least possible effects in the transmitted speech signal arise for each fault. Therefore, the method according to the invention is characterized in that information signals about the reliability of the received bit blocks, especially the error properties thereof, are produced as a quality feature during the channel decoding and in that, in dependence on these information signals, different code words of the codewords derived during the channel decoding are modified differently as error masking measures.

The method according to the invention is based upon the possibility of detecting the degree of faults more accurately during the channel decoding and, therefore, of carrying out different measures for error masking in a purpose-oriented way.

Especially in the known radio telephone system defined above, in which a first code word group in the received bit block denotes filter coefficients, a second code word group amplitude values, a third code word group long-term coefficients and a fourth code word group individual coded residual signals of the speech signal for the reconstruction of transmit speech signals, and predefined bits of code word groups are combined with a test word at the transmitting end, which test word is recovered at the receiving end, it is advantageous that dig channel decoding an error value in accordance with an estimated bit error rate is formed and compared with various error thresholds and in that, in dependence on the exceeded error threshold and on the value of a fault indicator which depends at least on an error detected via the test word, one of a number of predefined error classes is formed and for several error classes at least the first two code word groups are modified. The forming of error classes makes it possible to select measures for modifying code words in a simple manner.

In the known radio telephone system the fault indicator depends only on the detection of an error via the test word or on the recognition of a bit block as a control word without speech information. For better tuned error masking measures, however, still further error properties should be taken into consideration. A further embodiment of the invention in which, furthermore, degrees of error masking applicable to only few error classes are possible, is therefore characterized in that the fault indicator is a binary value and is formed if at least one of the following conditions is satisfied:

a) an error is detected via the test word, b) a metric value formed during the channel decoding exceeds a given metric threshold, c) the error value exceeds a predefined first error threshold;

in that a first error class is formed if the error value lies between a second and a third error threshold if the binary fault indicator is lacking and for this first error class in the first code word group the indications for at least the first two filter coefficients are compared with filter thresholds and, if at least one indication exceeds this filter threshold, the modified first code word group is formed by the first code word group of the previous stored bit block and in the second code word group each amplitude value is compared with an average amplitude value derived from the amplitude values of the previous bit block, and in the case of a deviation from this average amplitude value to a predefined extent in the modified code word group, is replaced by this average amplitude value, and the modified third and fourth code word groups are equal to the corresponding received code word group, in that a second error class is formed if the error value in the available binary fault indicator does not exceed a fourth error threshold or, if the binary fault indicator is lacking, the binary fault indicator was available in the previous bit block and the error value in the current bit block exceeds a fifth error threshold and for this second error class the modified first and second code word groups are the corresponding stored code word group of the previous bit block and the modified third and fourth code word groups are equal to the corresponding received code word groups, and in that a third error class is formed if the error value of the available binary fault indicator exceeds the fourth error threshold while for this third error class the modified first, second and third code word groups are the stored code word groups of the previous bit block and the modified fourth code word group consists of a random value. In this context it is highly advantageous that the modified fourth code word group consists of either the received code word group or random values, but that never the fourth code word group of the previous bit block is to be used for this purpose, so that the memory for storing the code words of the previous bit block can have a smaller size, because the fourth code word group contains extremely many bits.

In the known radio telephone system, not only the bit blocks containing fixed-pattern code words, but also bit blocks containing control information are transmitted, the latter, however, occurring much more rarely than the bit blocks containing code words. This constrains the possibility of transmitting extensive control information and requires a multiplicity of successive bit blocks and thus relatively much time. If, consequently, a large mount of control information is currently to be transmitted as is the case, for example, when a mobile station is connected to another fixed station, a complete bit block which is normally reserved for speech information in the known system is used for control information, which bit block thus does not contain speech information or code words for speech decoding. As this case corresponds to an extremely disturbedly received bit block containing speech signal code words, which bit block cannot be used for producing transmit speech signals, it is advantageous according to a first embodiment of the invention that for a bit block recognized as a control word without speech information, the error masking measures are carried out as is done for the third error class. In this manner a bit block containing only control information hardly affects the supplied speech signals.

In the case of faults on the transmission path it may occur that, as a result, not only one bit block, but two or even more successive bit blocks cannot be used or only to a limited extent for the reconstruction of speech signals. In that ease, especially in the case of a rather long sequence of bit blocks received disturbedly, the immediate repetition of all the code words of the most recently undisturbedly received bit blocks would lead to a noticeable mutilation of the reproduced speech signals. In the known radio telephone system it is therefore normal that when an error is detected via the test word in two successive bit blocks, the first modified code word group is the stored first code word group of the previous bit block, and the second modified code word group contains the amplitude values of the stored second code word group reduced by a fixed value, and the stored second code word group is replaced by the modified second code word group. As a result, fading speech signals are generated which is less disturbing to the user. A further improvement for this case is characterized according to a further embodiment of the invention in that in a bit block for which the second error class is formed, the third and fourth modified code word groups are the unchanged code word group of this bit block and in that in a bit block for which the third error class is formed the second modified code word group contains for all the amplitude values an average value which is formed from the amplitude values of the stored second code word group except for the smallest and the largest amplitude value, and the third modified code word group is the stored third code word group of the previous bit block and the fourth modified code word group consists of a random value. Also in this case there is distinguished what effect the faults have on the received bit block, so that still parts of the information in the faulty bit block are used, if the fault is not too large, so that a better transition in the reproduced speech signal is realised when, subsequently, bit blocks containing no faults or a few faults are received. Also in that case it is not necessary to store the fourth code word group of the most recently undisturbedly received bit block.

In speech pauses, in which there are no speech signals to be transmitted but only background noise, transmitter energy should be saved especially in the mobile stations. For this reason it is purposeful that the transmitter consuming the most energy can be switched off almost completely. But, this is to be noticeable to the receiving end. In the known radio telephone system it is therefore normal that during speech pauses a background noise is generated as a speech signal, which noise is formed from the first two code word groups of a bit block which will be referenced a background noise bit block. Such a background noise bit block is transmitted once at the end of a speech signal and then every haft a second if them are rather long speech pauses. During transmission of such a background noise bit block, however, there may be faults which may be heard, for example, as too loud background noise or as an annoying interference noise in the reproduced speech signal. Therefore, in the known radio telephone system, if an error is detected in the received background noise bit block via the test word, the first two code word groups of the most recently undisturbedly received bit block which is the last bit block in a background noise bit block following a speech signal, are used for this speech signal. For the third and fourth code word groups are always used fixed random values. Here too it is possible, however, that during the transmission of a background noise bit block faults are such that no error can be made detectable via the test word. In that case a background noise bit block would be reproduced for about half a second until the next background noise bit block were transmitted, which background noise is generated from mutilated code words and is perceived as annoying. According to a further embodiment of the invention it is therefore purposeful that for a reliably detected background noise bit block, in which the error value lies below a predefined sixth error threshold, the modified first code word group is the received first code word group and in the received second code word group the two extreme amplitude values are omitted and the avenge value of the remaining amplitude values is used for all the amplitude values in the modified second code word group, and in that for a reliably detected background noise bit block in which the error value lies above the sixth error threshold or in which the binary fault indicator is present, or for an unreliably recognized background noise bit block, the first or second code word group received in a previous bit block is used as a modified first or second code word group. Because the error value is taken into account and thus the amplitude value is freed from extreme values and the avenge value thereof is determined, there is achieved that practically under all circumstances non-disturbing background noise is produced.

In the previously defined measures for error masking, an error value is used which denotes an estimated bit error rate in the received bit block. According to an embodiment of the invention such an error value is formed in that the channel decoded channel bits are channel coded again and the bit positions of the re-coded bits are compared with those of the received bits and bit positions having different bit values are counted to produce a count, and the error value is derived from the count. As especially a channel coding of bits requires only little circuitry and cost, the error value can be simply formed in this manner.

BRIEF DESCRIPTION OF THE DRAWINGS

Embodiments of the invention will be further explained with reference to the drawing in which.

DETAILED DESCRIPTION OF THE PREFERRED EMBODIMENTS

Figure 1:
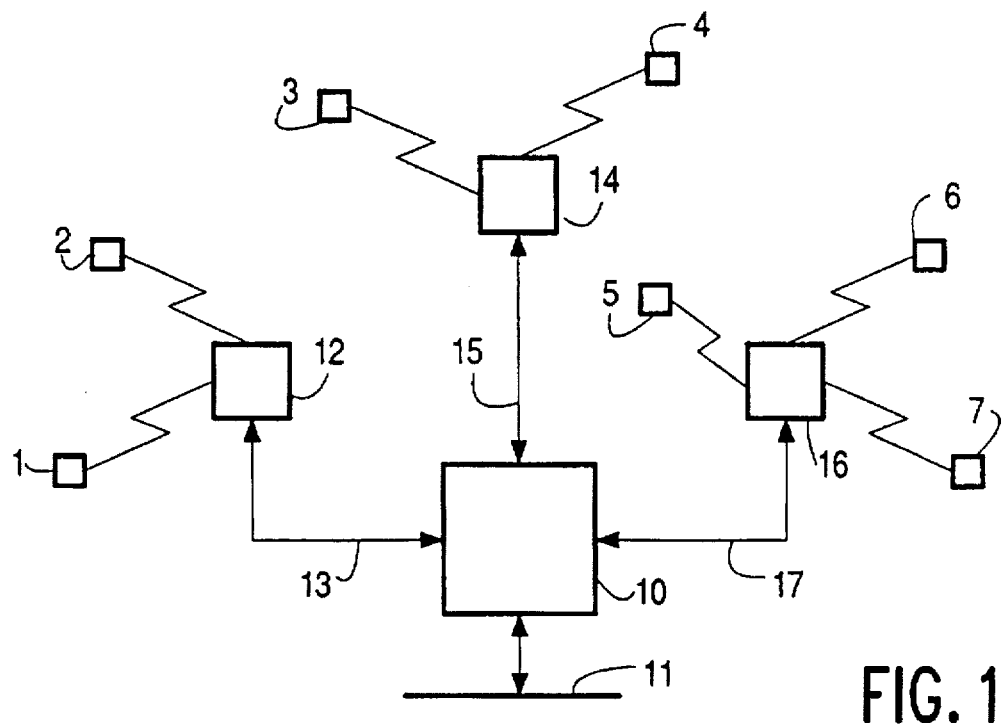
FIG. 1 gives a diagrammatic representation of a plurality of mobile stations and a plurality of fixed stations with one central station.

FIG. 1 gives a diagrammatic representation of the structure and cooperation of the individual units of a radio telephone system according to the GSM standard. A plurality of mobile stations 1 to 7, for example, telephones installed in private cars or carried along by the users as portable telephones, are coupled to fixed stations 12, 14 and 16 via radio links. The fixed stations 12, 14 and 16 are connected to a central station 10 by lines 13, 15 and 17, which central station establishes the connection to the wirebound telephone network 11. The mobile stations 1 to 7 and the fixed stations 12, 14 and 16 comprise controllers for establishing or changing, as required, a radio connection, for example if the mobile station 2 moves closer to fixed station 14 and the available radio connection to the fixed station 12 becomes ever more unfavourable. In such a case there is automatically a change of the radio connection of the mobile station 2 to the fixed station 14. Furthermore, the mobile stations 1 to 7 and the central station 10 comprise arrangements which subject a speech signal to an extensive speech coding method to produce cede words according to the so-termed GSM standard which is described, for example, in above journal of "Frequenz", 42 (1988), Vol. 2/3, pages 85 to 93, and the bits of certain bit positions of the code words are coded in the mobile stations 1 to 7 and in the fixed stations 12, 14, 16 by means of a test word or by means of a redundant channel coding to make a certain error masking possible at the receiving end. A high-frequency carrier is modulated with the coded bits in which case the coded bits are transmitted in bit blocks. As the invention does not relate to the controllers and the transmitting arrangements, they are not further explained here.

Figure 2:
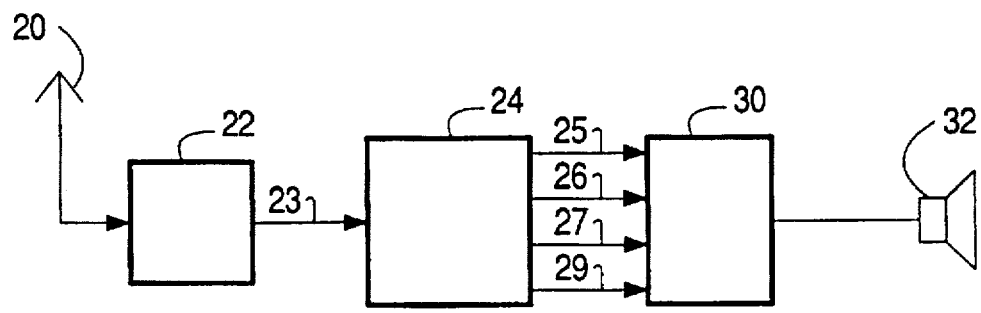
FIG. 2 shows the basic structure of the receiving section of a mobile station.

Furthermore, each mobile station and each fixed station comprises a receiving arrangement. FIG. 2 shows in a diagrammatic way a receiving arrangement of a mobile station. The receiving arrangement comprises an antenna 20, which is usually also the transmitting antenna, and a receiver circuit 22 to amplify and demodulate the high-frequency signal, and the demodulated channel bits are transmitted on line 23. They are applied to a channel decoder 24 which recovers the code words of the received bit blocks from the channel bits by error correction measures and supplies them on the output 29. The channel decoder 24 comprises, for example, a Viterbi decoder which produces a metric value on a further output 25 to express the reliability of the decoded bits such as is described, for example, in the title by M. Bossert "Kanalcodierung" in the book sequence "Informationstechnik", B. G. Teubner, Stuttgart 1992, especially in chapter 8.5. Furthermore, the channel decoder 24 produces a signal on an output 26 when an error has been detected in the data contained in the channel bits on the line 23 via the test word. Finally, the channel decoder 24 produces an error value on an output 27 to express an estimated error rate in the received bit block. A possibility of generating such an error value will be explained herein after.

The outputs of the channel decoder 24 lead to a unit 30 which comprises here in the mobile station the error masking and the speech decoder to generate the transmit speech signals which are made audible through the loudspeaker 32. The structure of a speech decoder for generating the speech signals is determined by the speech signal coding method at the transmitting end and also known from said publication. The basic structure of an error masking arrangement and the error masking measures to be implemented thereby will be explained herein after.

Figure 3:
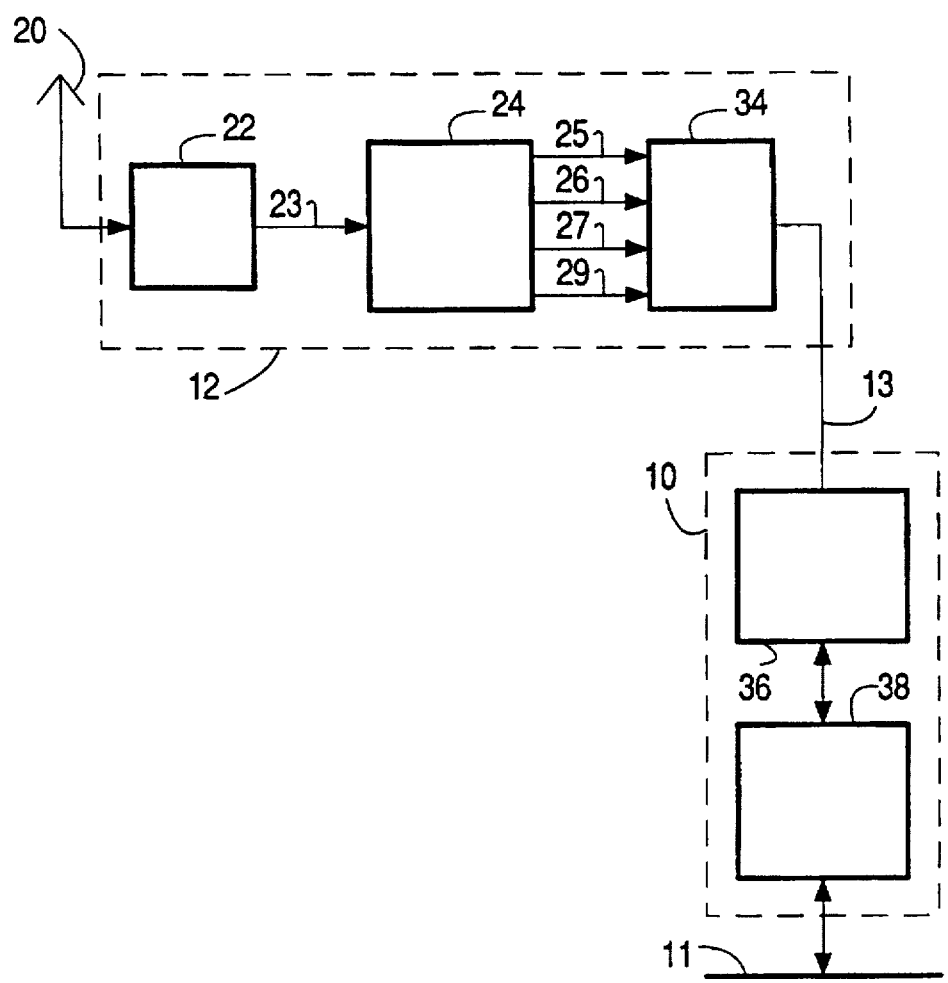
FIG. 3 shows the basic structure of the receiving section of a fixed station and its connection to the central station.

FIG. 3 shows an outlined block circuit diagram of the whole receiving path of a fixed station, in this case station 12, and the central station 10 connected thereto. This receiving path comprises again an antenna 20 and a receiver with demodulator 22 in the fixed station 12 which receiver amplifies and demodulates the high-frequency signals and feeds them to line 23 as channel bits. These channel bits are applied to a channel decoder 24 and the two units 22 and 24 are substantially structured as the corresponding units are in FIG. 2. In FIG. 3, however, an error masking circuit 34 is connected to the channel decoder 24 i.e. to its outputs 25, 26, 27 and 29, which circuit is also included in the fixed station. This error masking circuit 34 carries out all the error masking measures on the code words produced by the channel decoder 24 and produces only code words that can be applied directly to the speech decoder and processed there. These modified code words are applied to the speech decoder 36 in the central station 10 via line 13 which represents the so-called Abis interface. Via this Abis interface 13, additional control signals among which there is also a signal indicating whether a transmitted group of code words is error-free, are also transported in known manner in the time-division multiplex mode. Since the modification of code words is completely carried out in the fixed station in the error masking circuit 34 as long as this is possible, this error signal always has the logic "0" value, so that in the speech decoder 36 in the central station 10 no error masking measures need to be carried out any longer whereas this was necessary in the arrangements used to date. No modifications are then necessary in the speech decoder 36, only the error masking options which it usually has are not used.

The decoded speech signals are applied in the central station 10 to a controller 38 which transports these speech signals to the wire-bound telephone network 11.

Figure 4:
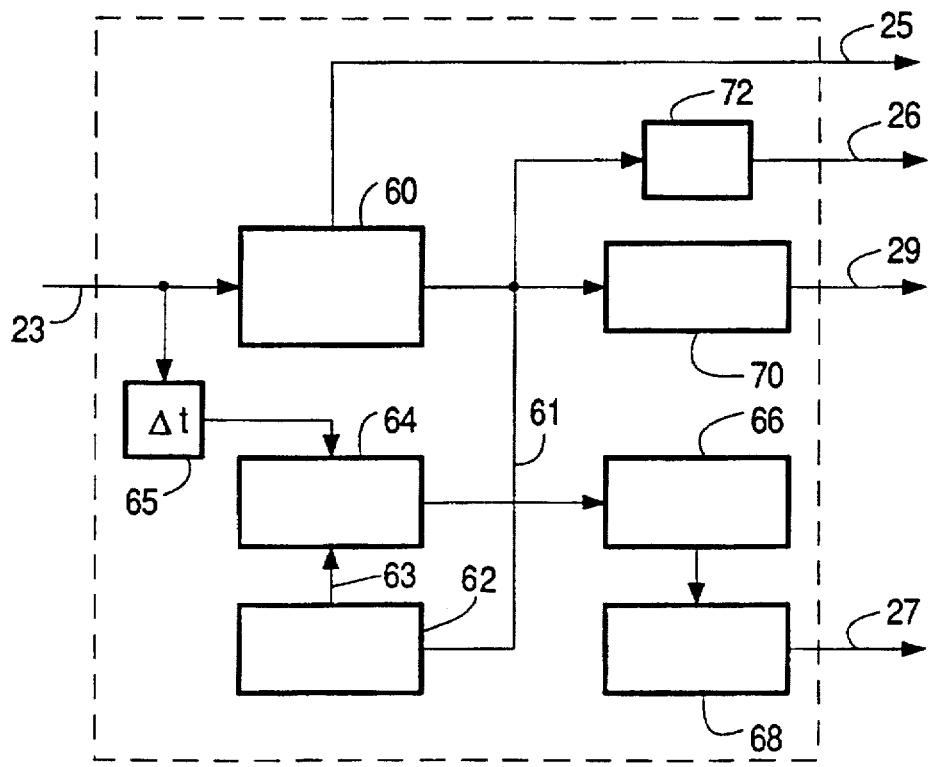
FIG. 4 shows the basic structure of a channel decoder with the production of further output signals which denote the reliability of the received bit blocks.

The structure of a channel decoder 24 in FIG. 2 and FIG. 3 is shown in more detail in FIG. 4. The essential part of the channel decoder 24 is, for example, a Viterbi decoder 60 which receives the channel bits on line 23 as soft decision information i.e. as reliability information and supplies the decoded code words on line 61. A part of the channel bits on line 23 is not channel coded and is then passed on unchanged by the decoder 60. In addition, the decoder 60 supplies a metric value on line 25, which value represents a degree of reliability of the decoded channel bits on line 61.

A part of the bits of a bit block at the transmitting end has a test word which contains three bits and is obtained from the horizontal sum of the bit values of a number of bit positions. In the test unit 72 this horizontal sum is again formed for the decoded bits on line 61 and compared with the next three bits of the test word. If there is no correspondence, an error signal is produced on line 26.

In the channel bit stream on line 23 the bits of the code words are not in the right order, but scrambled for reasons of the highest achievable error protection. In the subsequent error masking arrangement and especially in the speech decoder the code words are needed coherently, however, and, therefore, a sorting unit 70 is provided which brings the bits of the code words again in the right order and consecutively supplies the complete code words on line 29.

Finally, the decoded bits on line 61 are also applied to a channel coder 62 which has a like structure to that of the channel coder at the transmitting end and, in essence, includes only several delay elements and several combining elements. In this manner, if all the transmission errors can be corrected or if there is error-free transmission, the same bit sequence is to occur on output 63 of channel decoder 62 as on line 23, disregarding a pure delay caused by the channel decoder 60 and the channel coder 62. The channel bits on line 23 are delayed in a delay stage 65 by this period of time and the two signal sequences are applied to a comparator 64. All the bit positions on which non-matching bit values occur on the two inputs of the comparator 64 are counted in a counter 66 and at the end of a bit block an error value is derived in a stage 68 from the count of counter 66 then reached, specifically by normalizing the count with a fixed normalization value, and the error value is supplied on line 27. The outputs of the channel decoder 24 are connected to an error masking arrangement which, together with the speech decoder in FIG. 2, forms a unit 30, but in FIG. 3 represents a separate unit 34. The structure thereof will be further explained in FIG. 5.

Figure 5:
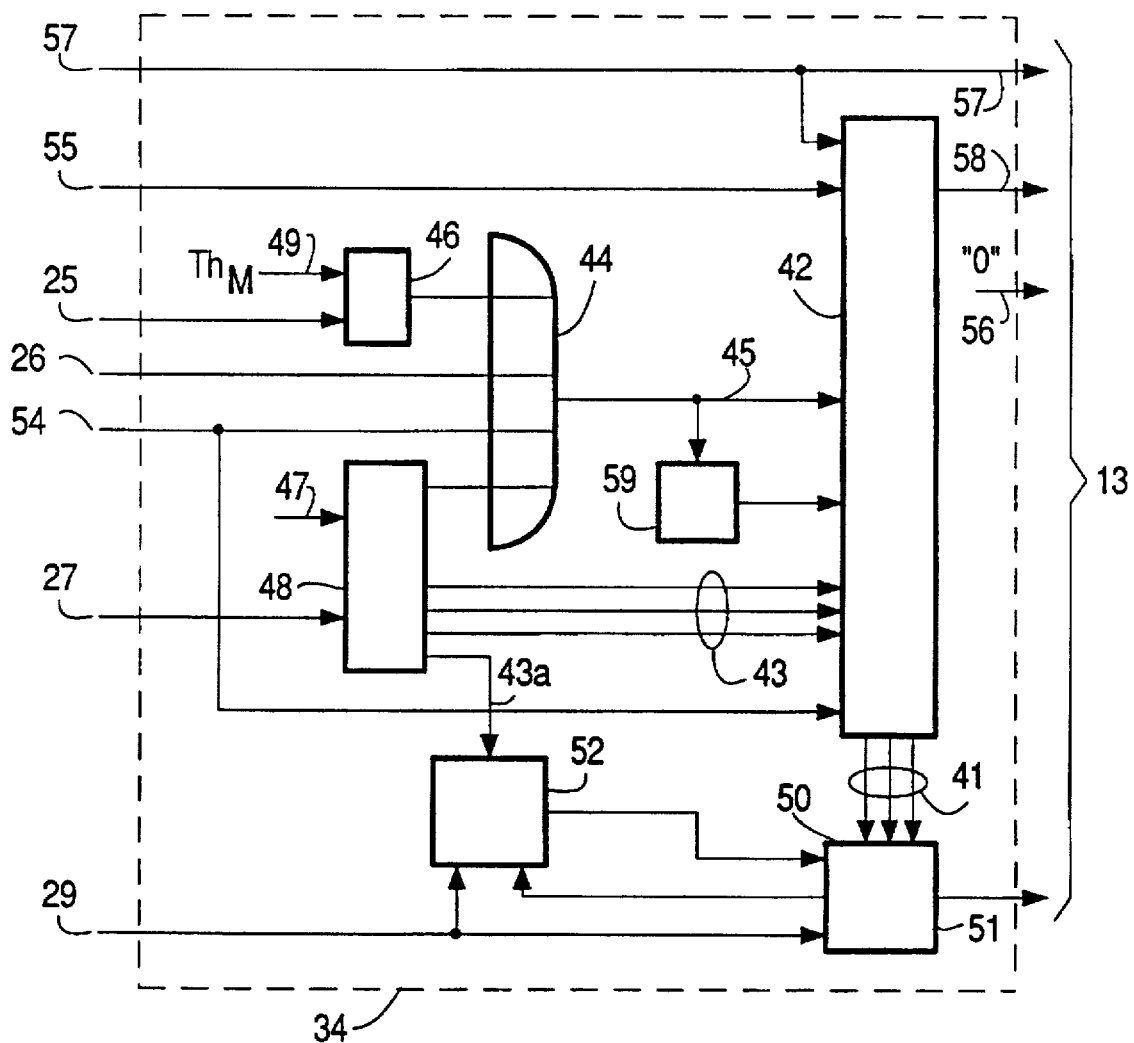
FIG. 5 shows the structure of an error masking circuit.

The metric value on line 25 in FIG. 5 is applied to a threshold comparator 46 where this metric value is compared with a threshold $TH_M$ received via line 49. This threshold $TH_M$ lies, for example, ⅘ or 80% of the total range of all possible metric values away from the optimum metric value. The output of the threshold comparator 46 leads to an input of an OR-gate 44 which supplies a binary fault indicator having a binary value on an output line 45.

The line 26 for the error signal, which signal is produced via the test word, leads to a second input of the OR-gate 44 whose third input is connected to a line 54 which carries a signal if a received block contains only control information and no speech information. A fourth input of the OR-gate 44 is connected to an output of a threshold comparator 48 which compares the error value carried on line 27 with a number of error thresholds received through an input 47. The threshold comparator 48 supplies a signal to the OR-gate 44 if the error value EV on line 27 exceeds a first error threshold Th1. Th1 lies, for example, at 1000. It is then assumed that the error value EV is derived as follows $$EV = \frac{PE}{100} \cdot 4096$$

from the percentage PE of channel bits which are detected as different with respect to the total number of bits of a bit block, so that only integral error values EV are processed.

The output line 45 of the OR-gate which carries the binary fault indicator to be referenced BFI in the following, leads to a buffer memory 59 which contains the BFI value of each previous bit block and also to a classification circuit 42 which forms various error classes for the received bit block and applies appropriate signals over the lines 41 to a code word controller 50. In there the code words received over line 29 are processed in accordance with the error classes and supplied on output 51 as modified code words. The classification circuit 42 receives still further signals, that is, further output signals of the threshold comparator 48 via lines 43, and receives the binary fault indicator of the previous bit block from the buffer memory 59, the signal from line 54 and also signals from lines 55 and 57. The signal on line 55 is trinary and indicates whether the received bit block is certainly, probably or not at all a background noise bit frame. On line 57 there is a clock signal which carries a pulse in every $24^{th}$ bit block.

The formation of error classes is made in dependence on conditions indicated in the Table.

TABLE

| 54 | (BFI) | BFI | EV | error class |
|---|---|---|---|---|
| 0 | 0 | 0 | Th2 ≦ EV < Th30 | 1 |
| 0 | 0 | 1 | EV < Th4 | 2 |
| 0 | 0 | 1 | EV ≧ Th4 | 3 |
| 0 | 1 | 0 | EV > Th5 | 2 |
| 0 | 1 | 1 | — | M |
| 1 | — | 1 | — | 3 |

Examples of the error thresholds are Th2=700, Th3=1000, Th4=1500 and Th5=670.

If the binary fault indicator is not available, or if BFI has the "0" value, already the first error class is formed if the error class lies between a second and a third error threshold Th2 and Th3, while this third error threshold is, for example, equal to the previously mentioned error threshold Th1, above which a binary fault indicator is produced via the threshold comparator 48 and the OR-gate 44. However, if the binary fault indicator is available i.e. BFI=1, the second error class is formed if the error value EV lies below a fourth error threshold Th4, because in that case parts of the received bit block can still be used, whereas the third error class is formed if the error value exceeds this fourth error threshold Th4 or is equal thereto. In all these cases it is assumed that the binary fault indicator Was lacking in the previous bit block i.e. (BFI)=0, in which case (BFI) denotes the binary fault indicator in the previous bit block, which binary fault indicator is stored in the buffer memory 59 in FIG. 5. If, in contrast, the previous bit block did contain the binary fault indicator, but the current bit block does not, a test is made whether the error value lies below a fifth error threshold Th5. Only if this is the case are the code words of the received bit block processed unmodified, otherwise the second error class is formed. However, if two successive bit blocks contain the binary fault indicator, a step-by-step fading circuit is initiated which is referenced "M" in the error class. Finally, if a signal is available on line 54, which signal features the received bit block as control information without speech information, in which case BFI=1, the third error class is formed because from such a bit block no parts can obviously be used for the production of speech signals.

If no error class is formed, the code word controller 50 in FIG. 5 passes the code words supplied over line 29 unmodified on to output 51. The error masking measures to be carried out for the individual classes will be explained hereinafter with reference to FIGS. 6a to 6f. In these Figures the top left hand block represents the received code word groups, the first code word group CW1 representing LPC filter coefficients, the second code word group CW2 representing amplitude values, the third code word group, formed by sub-groups CW3a and CW3b, representing long-term coefficients, and the fourth code word group, also formed by two sub-groups CW4a and CW4b, representing coded residual signals of the speech signal at the transmitting end. The bottom left hand block represents previous bit block code word groups stored in a memory 52 in FIG. 5 or code word groups of a bit block lying further back, for in this memory 52 are written code words of a bit block arriving over line 29 only if the error value for this bit block is smaller than a seventh error threshold Th7, thus EV<Th7. A typical value for this is Th7=750. This memory 52, however, contains only the first three code word groups, the fourth code word group of an earlier bit block is not necessary for the error masking measures used here which will be obvious from the following description. The right hand block in FIGS. 6a to 6f represents the modified code word groups supplied on output 51.

Figure 6A:
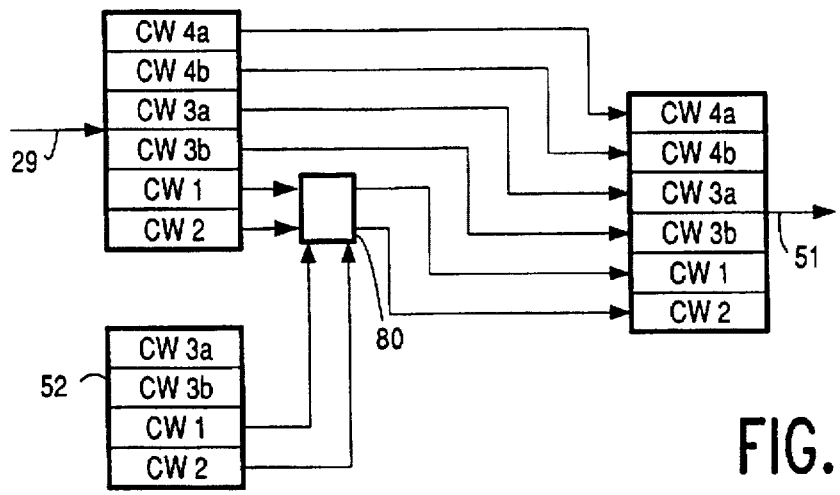
FIGS. 6a to 6f show diagrams to explain error masking measures for code words in the case of disturbedly received bit blocks.

First error class, FIG. 6a.

From the received code words only the code word groups CW3a,b and CW4a,b are passed on completely unmodified, whereas the first two code word groups CW1 and CW2 in block 80 are first tested and passed on in dependence on the test. For, if in the first code word group the decoded coefficients (reflection coefficients) having values around +1.0 or −1.0 occur, there may be uncontrolled oscillations in the output signal. Therefore, a threshold Thr is adopted for the absolute value of these coefficients. Thr lies, for example, at 0.96.

In the second code word group CW2 the amplitude values contained therein are compared with an average value which is formed from the amplitude values of the second code word group of the previous bit block from memory 52. Every new amplitude value deviating too much from this average amplitude value, that is, for which the difference from this average amplitude value $\geq D_{max}$ (a typical value is, for example, $D_{max}=16$), is replaced by this average amplitude value. If the deviation is smaller, that particular amplitude value from the first code word group of the new bit block is passed on directly.

Figure 6B:
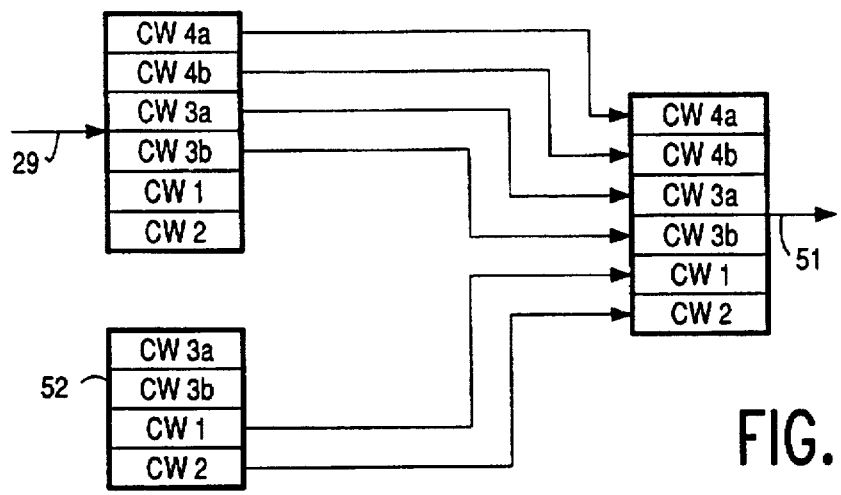

Second error class, FIG. 6b.

No decision is made any more here, but the first and second code word groups of the previous bit block from memory 52 are used and the third and fourth code word groups of the current bit block are taken over unmodified and supplied on output 51.

Figure 6C:
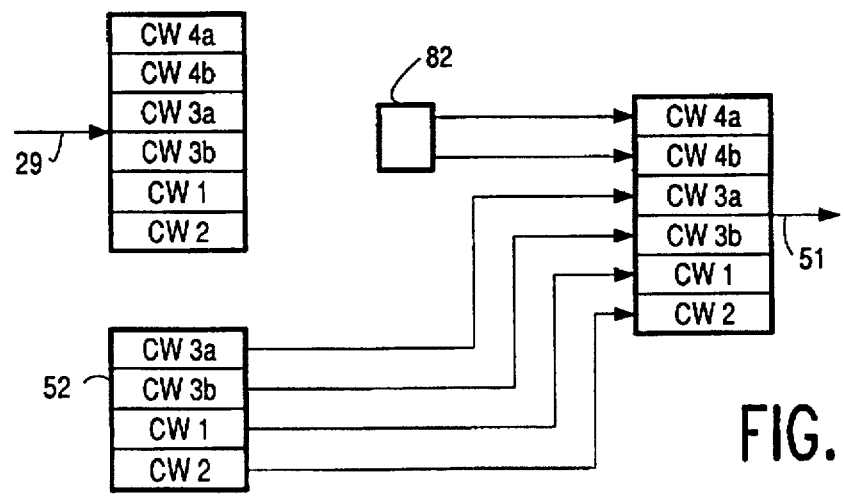

Third error class, FIG. 6c.

In this case no parts at all of the code words of the most recently received bit block are used, but the first, the second and the third code word groups are taken from the memory 52 and random values from a random value generator 82 are taken as the fourth code word group. The random value generator 82 may also comprise a memory which contains a limited number of random values and from which these random values are taken cyclically.

Figure 6D:
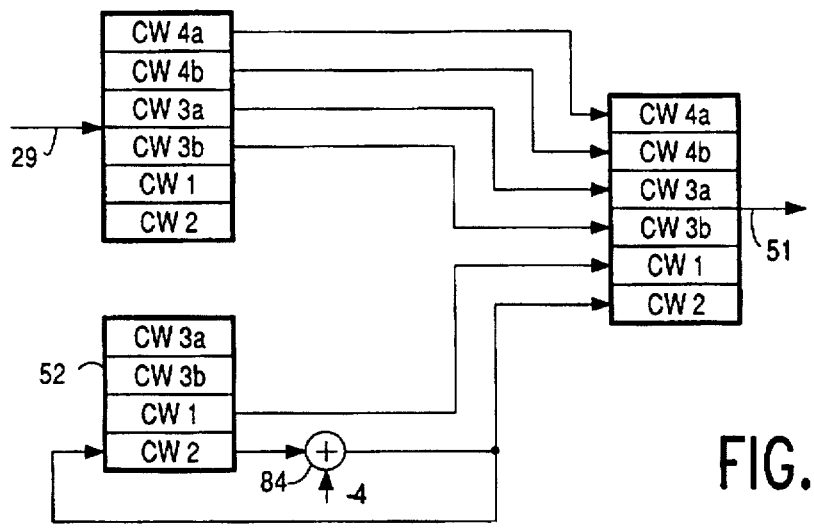
Figure 6E:
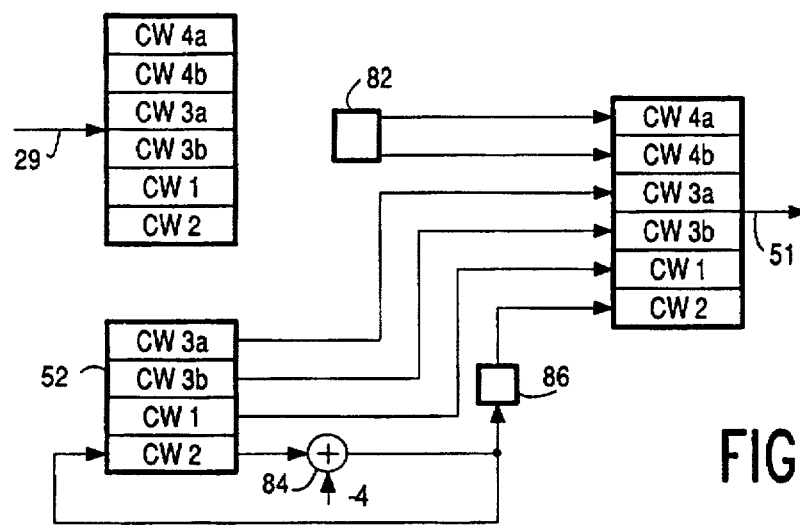

Fading circuit, FIGS. 6d and 6e.

If two or more successive bit blocks arrive, which contain each the binary fault indicator, a step-by-step fading is realised. For this purpose, each bit block is first tested whether the second or third error class is formed for this bit block. In the second error class the operation of the fading circuit is shown in FIG. 6d. It largely corresponds to FIG. 6b i.e. the third and fourth code word groups are taken over from the currently received bit block, whereas the first code word group is taken from the memory 52. In the case of the second code word group, on the other hand, the value 4 is subtracted from all the amplitude values in unit 84 and these results are not only taken as a second code word group to be supplied on output 51, but also written back to memory 52. It is obvious that in this manner, in the case of a rather long sequence of bit blocks, in which the binary fault indicator BFI=1, the amplitudes finally reach the 0 value in the case of fading, there art constantly tests whether all the amplitude values have the 0 value and, if they have, only the code words of a fixedly stored idle frame are supplied via output 51.

For the case where the third error class is formed for the repeatedly disturbed received bit block, the error masking measures are carried out according to FIG. 6e. Then no code word of the most recently received bit block is used any more, but the first and third code word groups are taken from the memory, the fourth code word group is replaced by random values from the random value generator 82, and for the second code word group the value of 4 is subtracted from all the amplitude values. The reduced amplitude values obtained in this manner, however, are not used directly, but in a block 86 the maximum and the minimum reduced amplitude value is suppressed and the average value is formed from the remaining amplitude values, and this average value is used for all the amplitude values of the second code word. Furthermore, the second code word group with all the reduced amplitude values is again written in memory 52. In this manner all the reduced amplitude values are available if, for example, in the bit block received next only the second error class is formed. Even in the event of fading with the error masking measures according to FIG. 6e the so-called idle frame is supplied via output 51 when the amplitude values have all reached the value of 0.

Figure 6F:
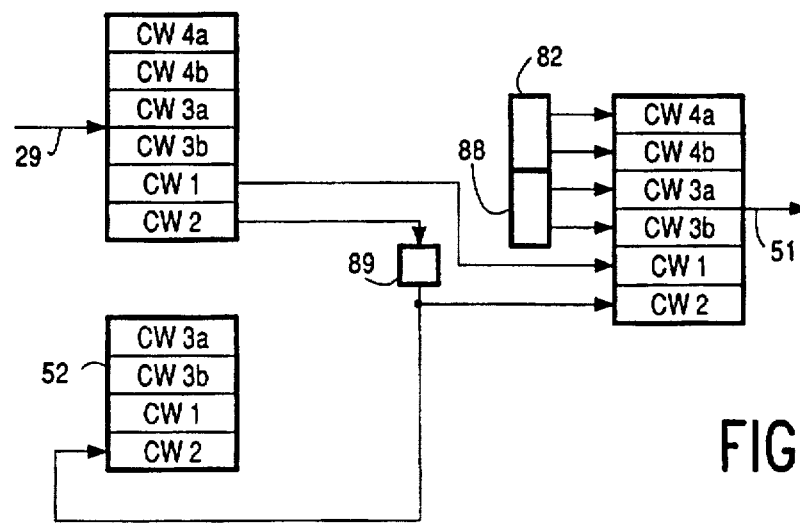

As explained before, in the case of speech pauses in which no real speech information is to be transmitted, at the end of the speech signal or, phrased more accurately, if no speech signal has been detected for four time slots, a background noise bit block is transmitted and then the transmitter is switched off for about half a second. If the speech pause takes longer, every one-half second a background noise bit block is recurrently transmitted. At the receiving end a background noise is generated from each background noise bit block for the associated time slot of about half a second, which noise is very similar to the real background noise and shows the listener that there is still a connection, but that the other party is not speaking for the moment. This background noise is to form a pleasant transition to the previous speech signal and therefore corresponds to a noise having a specific frequency spectrum. For this reason, the third and fourth code word groups need not be transmitted in the background noise bit block, but the third code word group is replaced by fixedly predetermined values and the fourth code word group again consists of random values. This is shown in FIG. 6f, in which the random values for the fourth code word group are again generated by a random value generator 82, whereas the fixed values for the third code word group are produced by an appropriate source 88. From the first two code word groups contained in the received background noise bit block, the first code word group is used unmodified, whereas from the second code word group the amplitude values are processed in block 89 which block, similarly to block 86 in FIG. 6e, works for the third error class during fading. The maximum and minimum amplitude values are then suppressed or set to zero and an average value is formed from the remaining amplitude values. This average value is substituted for the amplitude values of the second code word group and transmitted via the output 51 and further transferred to memory 52. The average formation after the suppression of the extreme values reliably avoids that, as a result of small non-established errors in the received background noise bit block, a background noise which is too loud or too low is produced.

Furthermore, also a background noise bit block is tested for a binary fault, more specifically, the binary fault indicator BFI is formed in the manner described before and the error value is compared with a sixth error threshold Th6 which lies close to the second error threshold Th2 from where the first error class is formed. In addition, the signal is to indicate that the received bit block has been recognized as a background noise bit block, is trinary with the three optional values indicating a reliably recognized background noise bit block, a bit block detected as a probable background noise bit block and a bit block recognized as a non-background noise bit block. If in a reliably detected background noise bit block the error value exceeds said error threshold, or if the binary fault indicator is present, or the background noise bit block is recognized only as a probable background noise bit block, unlike FIG. 6f, the first two code words, are not used from the most recently received bit block, but the first two bit blocks stored in memory 52 are taken and supplied on the output 51 together with the values taken from blocks 82 and 88. So doing the contents of the memory 52 are not changed.

As observed before, in rather long speech pauses the background noise bit blocks are transmitted about every half a second together with a clock signal which is coded on a specific position in each $24^{th}$ bit block. As a result, the second background noise bit block can also be transmitted shortly after the first background noise bit block depending on whether the speech signal relative to the clock signal has stopped.

It should be taken into consideration that also a background noise bit block may be disturbed so strongly on transmission that it is no longer recognizable as such in the receiver. Since, on the other hand, as discussed before, a recurrent background noise bit block is transmitted with a clock signal only every $24^{th}$ bit block, after a background noise bit block in a bit block containing a clock signal there is waited for another background noise bit block to be detected after a period of 25 bit blocks. If another background noise bit block is not detected, but if only bit blocks containing a binary fault indicator BFI=1 are received, here too a fading is initiated. This is effected for the first and second code word groups in like manner to that shown in FIG. 6d, while the values of the blocks 82 and 88 are further used for the third and fourth code word groups. If, finally, with this fading, all the amplitude values are equal to zero, the output 51 is switched over to afore-mentioned idle frame.

If, on the other hand, after a recurrently transmitted background noise bit frame, a bit frame is received that cannot be recognized as a background noise bit block, but in which the binary fault indicator BFI=0, it must 6e a bit block containing real speech data and in that case speech decoding is immediately switched back to.

Thus in all the situations of reception, blocks are generated containing unambiguous code words in which a further error masking option is no longer possible because this has already taken place in the code word controller 50 in FIG. 5. The various error masking operations are controlled via the lines 41 from the classification circuit 42, and even in the case described last of the background noise bit blocks, because the classification circuit 42 receives via line 55 the message whether it is certainly or probably a background noise bit block and via line 57 the clock signal that appears in every 24$^{th}$ bit block. The code words supplied on output 51 can thus be directly processed by the speech decoder. The error masking circuit 34 shown in FIG. 5, however, is assumed to be included in the fixed station as observed before, in which the speech decoder is included in the central station 10 in FIG. 1 or 3. The transmission of code words to this central station is effected via the already described Abis interface via which, in stations already available, an identification is expected whether the transmitted code words are background noise code words transmitted via line 58 in FIG. 5 or the clock signal on line 57 which is also expected in known stations. Furthermore, a signal is expected in the speech decoder, which signal states whether the transmitted code words are error-free, because in stations available thus far the error masking is to be effected in the speech decoder. Seeing that in this case only error-free code words are transmitted, constantly the value of "0" is carried over line 56 to signal the speech decoder in the central station that only error-free code words are transmitted. As a result, no modification is necessary for the speech decoder in the central station to be able to cooperate with an error masking circuit as shown in FIG. 5.

We claim:

1. A system comprising a first station and at least a second station, for transmitting speech signals between the stations, in which each station comprises a transmitting section for converting the speech signals of a time slot of given length to a plurality of bit code word groups having different connotations and for converting the bits to channel bits of a channel code and for transmitting the channel bits as a bit block, and also comprises a receiver which includes a receiving section for receiving and demodulating transmitted bit blocks to produce channel bits and which receiver includes a channel decoder for producing code word groups which have different connotations from the channel bits on a channel output and for producing error detection signals on at least one error output, at least one station comprising an error masking circuit coupled to the channel output, which error masking circuit includes a memory for code word groups of a previous bit block to produce modified code word groups in response to error detection signals, and a speech decoder for producing speech signals from the modified code word groups, wherein the channel decoder of at least several stations in the system is arranged for supplying on at least one error output error signals which indicate the extent of the fault in the received bit block and the error masking circuit is arranged to store in the memory only several of the code words of a previous bit block and, in dependence on error signals, to modify at least several of the code words of the received bit block in a different manner.

2. The system as claimed in claim 1, in which in each station the transmitting section is arranged for producing a first, a second, a third and a fourth code word group from the speech signals of each time slot and which code word groups each contain several bits, for forming from the bits on predefined bit positions of all the code words together a test word of at least one bit and for transmitting this test word together with the channel bits of the bit block, wherein the channel decoder is arranged for supplying on a first error output a test word error signal and, additionally, on a second error output an error value, and the error masking circuit includes a first threshold comparator for comparing the error value with several error thresholds, a fault indicator coupled at least to the first error output of the channel decoder for producing a fault indication signal on the first error output in dependence on at least the test word error signal, a classification circuit coupled to the first threshold comparator for producing one of a number of different error class signals in dependence on the exceeded error threshold and the fault indication signal, and includes a code word controller driven by the error class signals, to modify, in dependence on produced error class signals, at least several of the code word groups supplied by the channel decoder, more specifically, by substituting a code word group derived from the code words of the memory for several of the code word groups supplied by the channel decoder.

3. The system as claimed in claim 2, in which the first station is a fixed station and the second stations are mobile stations, characterized in that also in the fixed station the channel decoder is arranged for producing at least the error signals and the error masking circuit is provided for modifying the code words of the channel decoder in dependence on the error signals in the fixed station.

4. A receiver for receiving bit blocks of which each bit block is formed by speech signals of a time slot of a given duration, in that the speech signals are converted to a plurality of code word groups consisting of bits and having different connotations and the bits of these code word groups are converted to channel bits of a channel code, which receiver comprises a receiving section for receiving and demodulating transmitted bit blocks to produce channel bits, a channel decoder for producing code words having different connotations from the channel bits on a channel output and for producing error indication signals on at least one error output of an error masking circuit coupled to the channel output, which error masking circuit includes a memory for code word groups of a previous bit block, to produce modified code word groups in dependence on error indication signals, and includes a speech decoder for producing speech signals from the modified code word groups, wherein the channel decoder is arranged for producing on at least one error output error signals which indicate the extent of the fault in the received bit block and the error masking circuit is arranged for storing in the memory only several of the code words of a previous bit block and, in dependence on the error signals, modifying at least several of the code words of the received bit block in a different manner.

5. The receiver as claimed in claim 4, in which the channel decoder for producing, on the channel output, a first, a second, a third and a fourth code word group and, on a first error output, a test word error signal from each bit block, the first code word group denoting filter coefficients, the second code word group denoting amplitude values, the third code word group denoting long-term coefficients and the fourth code word group denoting individual coded residual signals of the speech signal for the reconstruction of transmit speech signals, and the test word error signal being derived from a test word contained in the bit block, wherein the channel decoder is arranged for additionally supplying an error value on a second error output, and the error masking circuit comprises a first threshold comparator for comparing the error value with several error thresholds, a fault indicator coupled at least to the first error output of the channel decoder and used for supplying a fault indication signal on the first error output in dependence on at least the test word error signal, a classification circuit coupled to the first threshold comparator, for producing an error class signal from a number of different error class signals in dependence on the exceeded error threshold and the fault indication signal, and comprises a code word controller driven by the error class signals, to modify, in dependence on applied error class signals, at least the first two code word groups produced by the channel decoder, specifically by replacing a code word group derived from the code words of the memory.

6. The receiver as claimed in claim 5, wherein the channel decoder is further arranged for generating on a third error output a binary fault signal to indicate a probable degree of binary fault in the received bit block, and the error masking circuit comprises a second threshold comparator to compare the binary fault signal with a binary fault threshold and in that the binary fault indicator comprises a combining circuit to generate the binary fault indication signal by logically combining an output signal of the second threshold comparator, an output signal assigned to a given error threshold of the first threshold detector, and the test word error signal.

7. The receiver as claimed in claim 5, wherein for generating the error signal, the channel decoder comprises a coding circuit for generating channel coded auxiliary signals from the decoded channel bits, a comparator for comparing the auxiliary signals with corresponding channel bits of the receiving section and for generating error signals in the case of non-correspondence, a counter for counting the error signals and an evaluation circuit coupled to the counter for generating an error signal on the second error output.

8. A method of transmitting speech signals between a first station and at least a second station, said method comprising the steps of:

converting the speech signals of a given time slot to a plurality of multibit code words having different connotations, recoding the bits into channel bits of a channel code and transmitting the channel bits as a bit block;

receiving the channel bits and decoding said channel bits into code words;

producing information signals indicating the reliability and possible errors of the decoded channel bits;

modifying different decoded code words differently depending on the information signals; and forming transmit speech signals from said modified code words.

9. The method as claimed in claim 8, in which a first code word group in the received bit block denotes filter coefficients, a second code word group amplitude values, a third code word group long-term coefficients and a fourth code word group individual coded residual signals of the speech signal for the reconstruction of transmit speech signals, said method including the steps of: combining predefined bits of code word groups with a test word at the transmitting end, said test word being recovered at the receiving end, forming an error value in accordance with an estimated bit error rate during channel decoding and comparing said error value with various error thresholds and, in dependence on the exceeded error threshold and on the value of a fault indicator which depends at least on an error detected via the test word, forming one of a number of predefined error classes and for several error classes at least the first two code word groups are modified.

10. The method as claimed in claim 9, wherein the fault indicator is a binary value and formed upon the satisfaction of at least one of the following conditions:

a) an error is detected via the test word, b) a metric value formed during the channel decoding exceeds a given metric threshold, c) the error value exceeds a predefined first error threshold, and including the steps of:

forming a first error class when the binary fault indicator is lacking and the error value lies between a second and a third error threshold, and for this first error class in the first code word group the indications for at least the first two filter coefficients are compared with at least one filter threshold and, when at least one indication exceeds said at least one filter threshold, the modified first code word group is formed by the first code word group of the previous stored bit block and in the second code word group each amplitude value is compared with an average amplitude value derived from the amplitude values of the previous bit block, and in the case of a deviation from this average amplitude value to a predefined extent, is replaced in the modified word group by this average amplitude value, and the modified third and fourth code word groups are equal to the corresponding received code word group, forming a second error class when the binary fault indicator is available and the error value does not exceed a fourth error threshold or the binary fault indicator is lacking and the binary fault indicator in the previous bit block is available and the error value in the current bit block exceeds a fifth error threshold, and for this second error class the modified first and second code word groups are set to the corresponding stored code word group of the previous bit block and the modified third and fourth code word groups are equal to the corresponding received code word group, forming a third error class when the binary fault indicator is available and the error value exceeds the fourth error threshold, and for this third error class the modified first, second and third code word groups are set to the stored code word groups of the previous bit block and the modified fourth code word group is replaced by a random value.

11. The method as claimed in claim 10, wherein for a bit block recognized as a control word without speech information, the error masking measures are carried out according to the third error class.

12. The method as claimed in claim 10, in which background noise is generated as a speech signal during speech pauses, which background noise is formed from the first two code word groups of a bit block which is featured as background noise bit block, wherein for a reliable detection of a background noise bit block in which the error value lies below a predefined sixth error threshold, the modified first code word group is the received first code word group and in the received second code word group the two extreme amplitude values have been omitted and the average value of the remaining amplitude values is used for all the amplitude values in the modified second code word group and in that for a reliably detected background noise bit block in which the error value lies above the sixth error threshold or in which the binary fault indicator is present, or for a non-reliably detected background noise bit block the first or second code word group received in a previous bit block is used as modified first and second code word groups.

13. The method as claimed in claim 9, in which when an error is detected via the test word in two successive bit blocks the first modified code word group is the stored first code word group of the previous bit block, and the second modified code word group contains the amplitude values of the stored second code word group reduced by a fixed value, and the stored second code word group is replaced by the modified second code word group, wherein in a bit block for which the second error class is formed, the third and fourth modified code word groups are the unchanged code word group of this bit block and in that in a bit block for which the third error class is formed the second modified code word group contains for all the amplitude values an average value which is formed from the amplitude values of the stored second code word group except for the smallest and the largest amplitude value, and the third modified code word group is the stored third code word group of the previous bit block and the fourth modified code word group consists of a random value.

14. The method as claimed in claim 9, wherein the error value is formed in that the channel decoded channel bits are again channel coded and the recoded bits are compared with the received bits as regards bit positions and bit positions having different bit values are counted to produce a count and the error value is derived from the count.

15. The method as claimed in claim 8, wherein for the bit block sent from one of said first and second stations the error masking measures are implemented integrally in the other of said first and second station and are only produced as error-free code words.

* * * * *